United States Patent
Howe et al.

(10) Patent No.: US 7,671,630 B2
(45) Date of Patent: Mar. 2, 2010

(54) USB 2.0 HS VOLTAGE-MODE TRANSMITTER WITH TUNED TERMINATION RESISTANCE

(75) Inventors: Scott Howe, Campbellville (CA); Dino A. Toffolon, Stoney Creek (CA); Cameron Lacy, Milton (CA); Euhan Chong, Mississauga (CA)

(73) Assignee: Synopsys, Inc., Mountain View, CA (US)

( * ) Notice: Subject to any disclaimer, the term of this patent is extended or adjusted under 35 U.S.C. 154(b) by 1250 days.

(21) Appl. No.: 11/192,871

(22) Filed: Jul. 29, 2005

(65) Prior Publication Data

US 2007/0024327 A1 Feb. 1, 2007

(51) Int. Cl.
*H03K 19/094* (2006.01)
*H03K 17/16* (2006.01)

(52) U.S. Cl. .......................................... 326/82; 326/30

(58) Field of Classification Search ............. 326/82–87, 326/30, 26
See application file for complete search history.

(56) References Cited

U.S. PATENT DOCUMENTS

| | | | |
|---|---|---|---|
| 6,674,313 B2 * | 1/2004 | Kurisu et al. ................. | 327/108 |
| 6,788,102 B2 * | 9/2004 | Atyunin et al. ............... | 326/30 |
| 6,922,077 B2 * | 7/2005 | Chandler et al. .............. | 326/30 |
| 7,071,728 B2 * | 7/2006 | Chandler et al. .............. | 326/30 |
| 7,218,136 B2 * | 5/2007 | Kasahara ..................... | 326/30 |
| 7,239,169 B2 * | 7/2007 | Isa et al. ..................... | 326/30 |
| 2004/0263204 A1 * | 12/2004 | Chandler et al. .............. | 326/30 |
| 2005/0110517 A1 * | 5/2005 | Chandler et al. .............. | 326/30 |

* cited by examiner

*Primary Examiner*—Rexford N Barnie
*Assistant Examiner*—Thienvu V Tran
(74) *Attorney, Agent, or Firm*—Bever, Hoffman & Harms, LLP; Jeanette S. Harms

(57) ABSTRACT

A high-speed universal serial bus (USB) transceiver includes a voltage-mode architecture for generating a USB signal. The voltage mode architecture reduces power consumption by reducing the current requirements for high-speed USB communications. The USB transceiver can include a reference voltage generator, a resistive element, and a switching element for completing and breaking a circuit including the reference voltage generator, the resistive element, and a data pin of a USB port to generate half of the differential USB signal (e.g., the D+ signal). A similar circuit can be used to generate the other half of the differential USB signal (i.e., the D− signal). The resistive element can be a set of parallel resistors in the transceiver, with the set of parallel resistors being specifically selected from a larger population of resistors to provide the specified resistance (45 Ω±10%) in the USB transceiver.

13 Claims, 4 Drawing Sheets

USB 2.0 HS VOLTAGE-MODE TRANSMITTER WITH TUNED TERMINATION RESISTANCE

BACKGROUND OF THE INVENTION

1. Field of the Invention

The invention relates to the field of computer electronics, and in particular, to a system and method for enabling low-power universal serial bus communications.

2. Related Art

The universal serial bus (USB) protocol is a popular communications protocol that allows a wide range of modern electronic devices and peripherals (e.g., scanners, digital cameras, personal digital assistants, and digital music players) to communicate with another peripheral. The present USB 2.0 specification ("Universal Serial Bus Specification", Revision 2.0, Apr. 27, 2000) defines three signaling levels that can be supported by USB-compliant devices. The three levels include a low-speed mode operating at 1.5 Mbps at 3.3 V, a full-speed mode operating at 12 Mbps at 3.3 V, and a high-speed mode that signals at 480 Mbps at 400 mV.

Modern high-speed USB 2.0-compliant devices include USB transceivers that are based on a current mode architecture for the high-speed transmitter, in which a current source drives the outgoing USB communications. For example, FIG. 1 shows a high-speed USB transmitter 100 (i.e., a device generating a high-speed USB signal) and a high-speed USB receiver 150 (i.e., a device receiving a high-speed USB signal). A USB cable 140 connects a USB port 111 on USB transmitter 100 to a USB port 151 on USB receiver 150 to enable communication between the two devices.

A USB cable (i.e., USB cable 140) is a four-line serial data bus. Two of the lines are power lines (i.e., VBUS and ground lines), and the other two lines form a pair of differential signal lines (i.e., D+ and D− lines). For clarity, communication between high-speed USB transmitter 100 and high-speed USB receiver 150 will be described with respect to only one half of the differential USB signal (i.e., with respect to signal D+). The inverted signal forming the other half of the differential USB signal (i.e., the D− signal) is generated in a manner substantially similar to that described with respect to the generation of the D+ signal. In accordance with the USB 2.0 specification, USB receiver 150 includes a termination resistor 160 connected between USB port 151 and ground (i.e., the ground supply voltage or lower supply voltage). A D+ signal received at USB port 151 is read from the junction between USB port 151 and resistor 160.

To generate the D+ signal, a high-speed USB transceiver 110 in USB transmitter 100 includes a current source 120, a switch S105, and a voltage-setting resistor 130. Current source 120, switch S105, and resistor 130 are connected in series between a supply voltage VDD and ground. When switch S105 is closed, a portion of current I121 supplied by current source 120 flows through resistor 130 to ground (i.e., current I131) to set the output signaling voltage at USB port 111, while another portion of current I121 flows through USB cable 140 and through resistor 160 in USB receiver 150 to ground (i.e., current I161). By switching switch S105 on and off, USB transceiver 110 generates the D+ USB signal transmitted from USB transmitter 100 to USB receiver 150 by USB cable 140.

The USB 2.0 specification requires that termination resistor 160 (i.e., the resistor coupled between the USB port and ground in the downstream device) have a resistance value equal to 45 Ω ±10%. Voltage setting resistor 130 is sized similarly, so that the currents flowing through both resistors are the same (i.e., current I131 is equal to current I161) and that the voltage drops across resistors 130 and 160 are the same. Therefore, to provide the requisite 400 mV D+ signal (i.e., half of the total 800 mV signal specified for high-speed USB 2.0 communications), both currents I131 and I161 must be equal to roughly 8.9 mA (equal to 400 mV (signal amplitude) divided by 45 Ω (resistance)). Accordingly, current source 120 must provide a total current I121 equal to roughly 17.8 mA (i.e., the sum of currents I131 and I161).

As the proliferation of USB-compatible devices continues to increase, the importance of power efficiency for those USB devices also increases. Unfortunately, the current-mode architecture used in conventional USB 2.0 transceivers (as shown in FIG. 1) is less than ideal in the realm of power efficiency. Specifically, because resistor 130 in transceiver 110 is used to generate the required signal voltage (i.e., 400 mV), current source 120 must effectively drive two parallel resistance paths to ground (i.e., through resistor 130 in USB transmitter 100 and through resistor 160 in USB receiver 150). Hence, current source 120 must generate twice as much current as is required by USB receiver 150.

Accordingly, it is desirable to provide a system and method for providing high-speed USB communications that reduces power consumption over the conventional current-mode transceiver architecture shown in FIG. 1.

SUMMARY OF THE INVENTION

To reduce power consumption in a high-speed USB transceiver, the conventional current-mode architecture can be replaced with a voltage-mode architecture. The voltage-mode architecture drives the USB signal using a voltage source, thereby eliminating the need for a voltage setting resistor coupled to ground in the USB transceiver. As a result, the additional current path to ground provided by the voltage-setting resistor is eliminated, and current requirements for the voltage-mode USB transmitter can be effectively halved over the current requirements for a current-mode USB transmitter.

In one embodiment, a high-speed USB transceiver (e.g., in a computer, computer peripheral, digital cameral, PDA, or digital music player) can include a voltage source, a resistive element, and a data pin in a USB port to generate half of a high-speed differential USB signal (e.g., the D+ signal). By having the voltage source provide a signal that switches between 0 and 800 mV, the USB signal level at the data pin in the USB port will be the specified 400 mV (due to the voltage dividing effect of the resistive element in the transceiver and the similarly sized termination resistor in the USB receiver). In one embodiment, the transceiver can include a set of parallel resistors and selection logic that defines the resistive element actually used in the generation of the USB signal by selecting a subset of those parallel resistors that provides a total resistance equal to the 45 Ω ±10% specified in the USB 2.0 specification. In another embodiment, the transceiver can include tuning resistors that can be used in place of the actual output resistors during tuning (i.e., during the selection process used to determine which combination of resistors will provide the 45 Ω ±10%). In another embodiment, the transceiver can include low-speed/full-speed circuitry for making and breaking a circuit including a second reference voltage source (e.g., providing 3.3 V), the resistive element, and the data pin in the USB port to generate half of a low-speed or full-speed differential USB signal.

A method for operating a USB device can include generating a reference voltage (e.g., 800 mV), and controlling switches in a circuit that includes the reference voltage generator, a resistive element, and a data pin in a USB port of the device to generate half of a differential USB signal. The method can further include selecting a portion of a set of resistors to define the resistive element, with the selection process involving selecting various combinations of resistors from the set until a total resistance of 45 Ω ±10% is achieved. In one embodiment, this selection process can be performed using replica tuning resistors in place of the actual output resistors, where the tuning resistors are matched to the output resistors. The use of tuning resistors allows the selection process to be performed without involving the actual output resistors. In another embodiment, the reference voltage can be switched from the 800 mV to 3.3 V to enable the generation of low-speed or full-speed USB signals.

The invention will be more fully understood in view of the following description and drawings.

DETAILED DESCRIPTION

To reduce power consumption in a high-speed USB transceiver, the conventional current-mode architecture can be replaced with a voltage-mode architecture. The voltage-mode architecture drives the USB signal using a voltage source, thereby eliminating the need for a voltage setting resistor coupled to ground in the USB transceiver. As a result, the additional current path to ground provided by the voltage-setting resistor is eliminated, and current requirements for the voltage-mode USB transmitter can be effectively halved over the current requirements for a current-mode USB transmitter.

Figure 1:
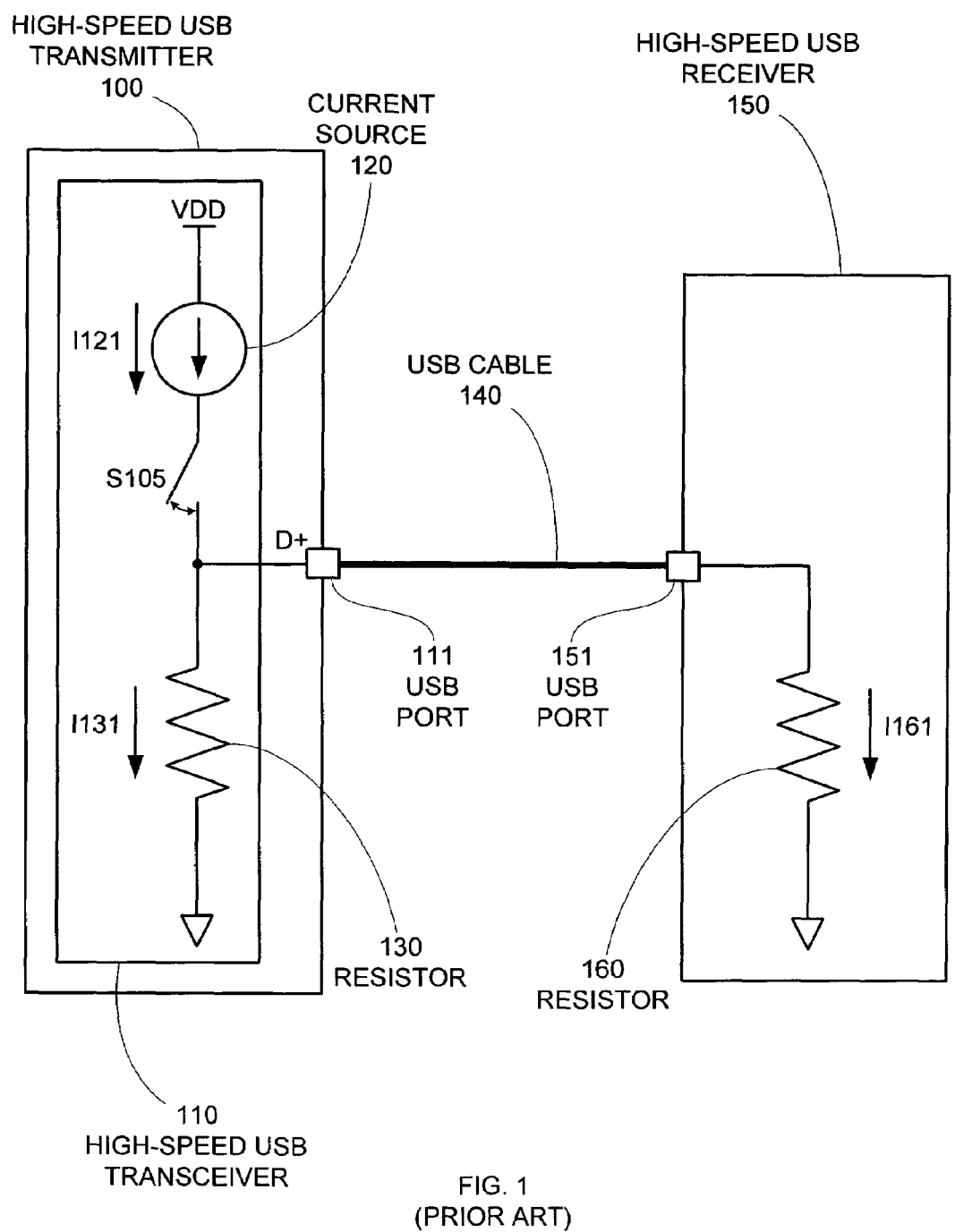
FIG. 1 shows a circuit diagram of a conventional USB transceiver based on a current-mode architecture.
Figure 2:
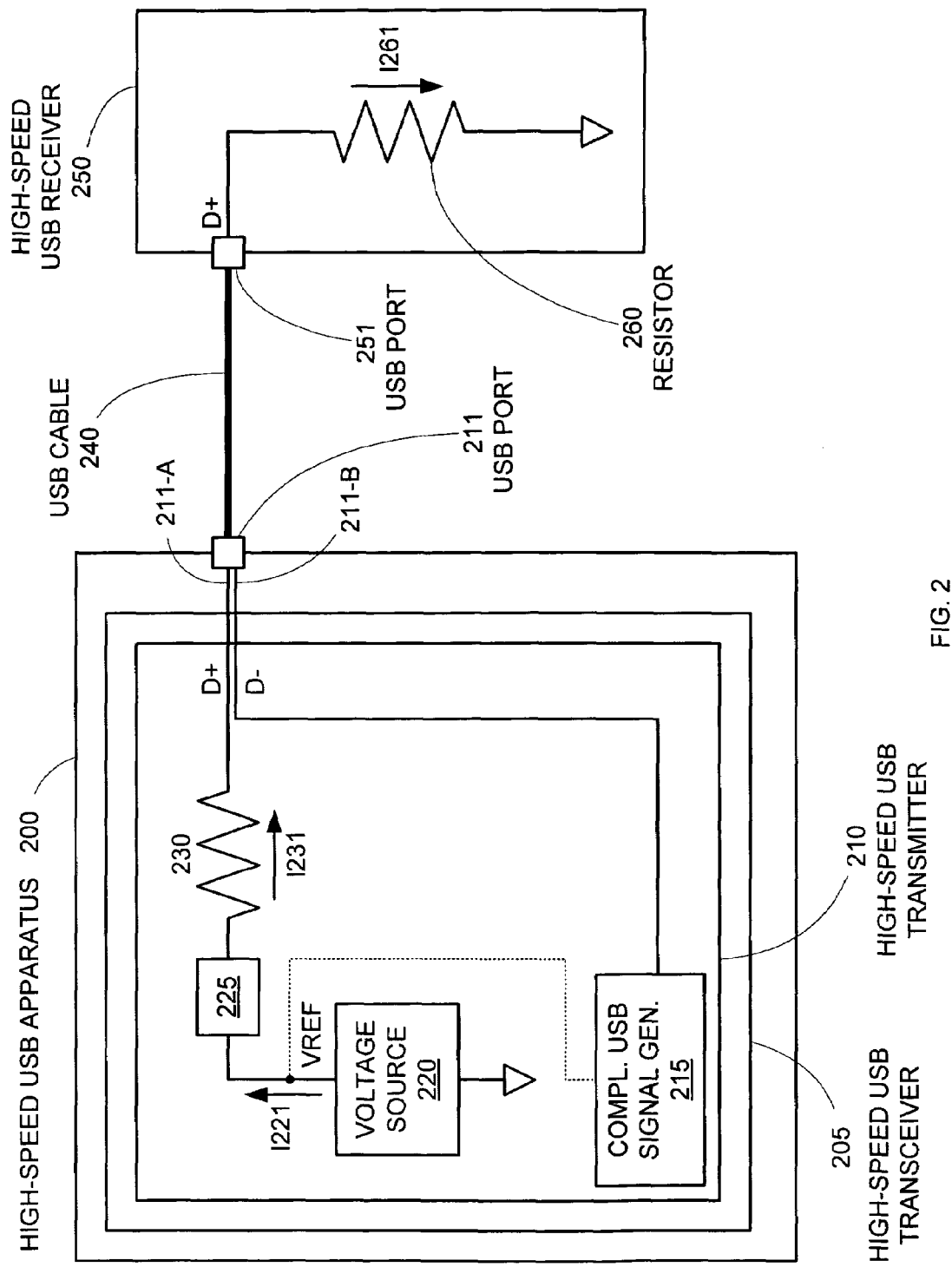
FIG. 2 shows circuit diagram of a USB transceiver based on a voltage-mode architecture.

FIG. 2 shows an embodiment of a high-speed USB apparatus 200 (e.g., a computer, computer peripheral, digital cameral, PDA, or digital music player) based on a voltage-mode architecture. A USB port 211 on USB apparatus 200 is connected to a USB port 251 on a high-speed USB receiver 250 by a USB cable 240. As described above with respect to FIG. 1, high-speed USB receiver 250 (in a downstream USB device not shown for clarity) is required by the USB 2.0 specification to include a termination resistor 260 (45 Ω ±10%) coupled between USB port 251 and ground. A USB signal D+ is generated by a high-speed USB transmitter 210 in a high-speed USB transceiver 205 in USB apparatus 200, and is transmitted from USB apparatus 200 to USB receiver 250 by USB cable 240 to enable USB communications between the two devices.

Note that, as described above with respect to FIG. 1, USB communications are performed using differential signaling, in which half of a differential signal (i.e., a D+ signal) is transmitted over one wire in USB cable 240, and the other half of the differential signal (i.e., a complementary D– signal) is transmitted over a second wire in USB cable 240. Therefore, USB cable 240 will include four wires (data D+ and D– wires and power and ground wires, not shown for clarity), and each USB port (e.g., USB port 211) will likewise include four pins (data D+ pin and data D– pin, power and ground pins, not shown for clarity). For exemplary purposes, the operation of high-speed USB transmitter 210 is described with respect to the generation of half of the differential USB signal (e.g., the D+ signal). However, it is understood that complementary USB signal generator circuitry 215 included in USB transmitter 210 can generate complementary signal D– forming the other half of the differential USB signal in a manner substantially similar to that described below with respect to the generation of signal D+. Note further that USB receiver 250 will also include a second resistor to ground (not shown) that is substantially similar to resistor 260 to receive the complementary D– signal.

High-speed USB transmitter 210 includes a voltage source 220, signaling circuitry 225, and a resistance element 230. Voltage source 220, signaling circuitry 225 and resistance element 230 are connected in series between a ground terminal (indicated by the inverted triangle) and USB port 211. Voltage source 220 provides a reference voltage VREF, which for reasons described in greater detail below, is 0.8 V. Signaling circuitry 225 provides a switching output between voltage VREF and ground (0 V) to resistance element 230, which, in accordance with the USB 2.0 specification, is sized to provide a resistance equal to 45 Ω ±10% (i.e., equal to termination resistor 260 in USB receiver 250). Note that while resistance element 230 is depicted as a single resistor for exemplary purposes, in other embodiments (such as described below with respect to FIG. 3B), resistance element 230 can comprise multiple resistors connected in parallel (or series) that provide a total resistance equal to 45 Ω ±10%.

The switching output of signaling circuitry 225 (between voltage VREF and ground) is provided by resistance element 230 at USB port 211 as USB signal D+ (i.e., half of the differential USB signal). When signaling circuitry 225 passes voltage VREF to resistance element 230, the voltage divider formed by resistance element 230 and resistor 260 pulls the D+ USB pin (in USB port 251 in receiver 250) high with an output resistance of 45 ohms. When signaling circuitry 225 switches to a grounded output (0 V), the D+ signal output from transmitter 210 is pulled to a logic LOW level with an output resistance of 45 Ω. Because resistance element 230 and resistor 260 (in receiver 250) have equal resistances (i.e., 45 Ω ±10%), the amplitude of signal D+ is simply half of voltage VREF. Because the required amplitude for high-speed USB communications is 800 mV, and because half of the differential signal is carried on each data line in USB cable 240, signal D+ must have an amplitude of 400 mV. Therefore, voltage VREF provided by voltage source 220 is simply 800 mV (i.e., 2×400 mV).

Due to the serial configuration of resistance element 230 in USB transmitter 210 and resistor 260 in USB receiver 250, a current I231 through resistance element 230 is the same as a current I261 through resistor 260, which in turn is the same as a current I221 supplied by voltage source 220. Specifically, currents I221, I231, and I261 are all roughly equal to 8.9 mA (i.e., voltage VREF (800 mV) divided by the sum of the resistances of resistance element 230 and resistor 260 (90 Ω)). Note that this current is half of the current required from the current-mode architecture used in a conventional USB transceiver (i.e., USB transceiver 110 shown in FIG. 1). In this manner, the voltage-mode architecture in USB transmitter 210 results in only a single path to ground for the D+ signaling circuitry (as opposed to the two parallel paths to ground that result from conventional current-mode USB transceiver architectures, as described with respect to FIG. 1), thereby halving power consumption over conventional USB transceivers.

Note that in one embodiment, voltage source 220 can be used to generate both USB signals D+ and D– (as indicated by the dotted line between the output of voltage source 220 and complementary signal generation circuitry 215). Because signals D+ and D– are complementary signals, only one of those signals will be driven by voltage source 220 at any given time. This voltage source "sharing" between the D+ and D− circuitry can beneficially create a constant (and therefore less taxing) loading condition on voltage source 220.

Figure 3A:
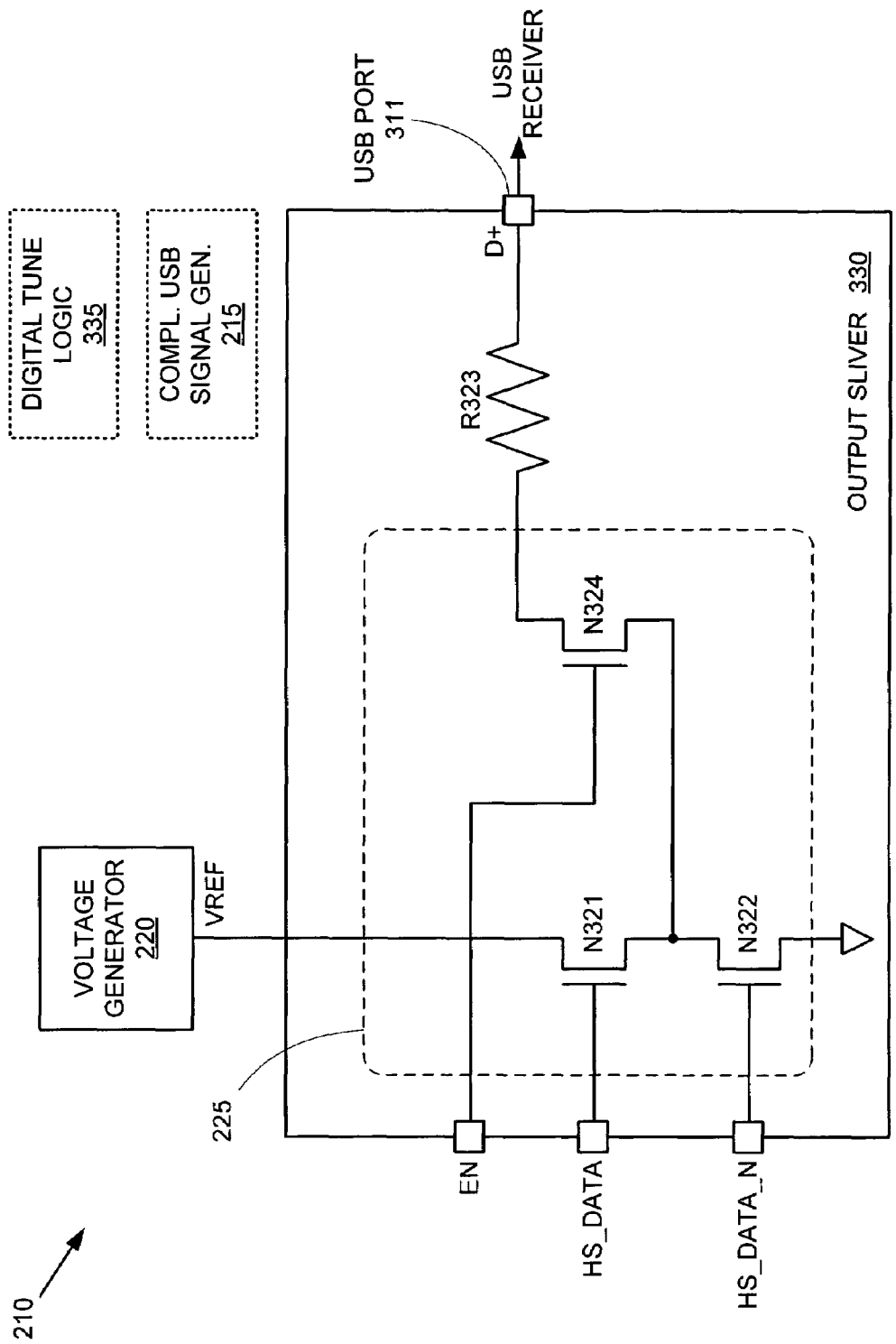
FIG. 3A shows a circuit diagram of an embodiment of the USB transceiver of FIG. 2.

FIG. 3A shows an exemplary circuit diagram of high-speed USB transmitter 210 that includes voltage source 220 for providing reference voltage VREF (i.e., 800 mV) and an output sliver 330 for generating USB signal D+. Note that the voltage source 220 can be implemented using any circuit capable of providing a stable voltage VREF.

Output sliver 330 comprises an output resistor R323 and an embodiment of signaling circuitry 225 that includes NMOS switching transistors N321, N322, and an optional NMOS enable transistor N324. USB transmitter 210 can include optional digital tune logic 335 for controlling the signals provided to the gates of transistors N321, N322, and N324 (if present). Transistors N321 and N322 are connected in series between the output of voltage source 220 and ground, whereas transistor N324 is connected in series between resistor R323 and the junction between transistors N321 and N322. Resistor R323 is connected between USB port 311 and the transistor N324. In one embodiment, transistors N321, N322, and N324 (if present) can be implemented as thick oxide devices to enable robust operation for a wide range of operating voltages (e.g., up to 3.3 V for low-speed/full-speed operation).

During high-speed operation, high-speed switching control signals HS_DATA and HS_DATA_N are supplied to the gates of switching transistors N321 and N322, respectively. Signals HS_DATA and HS_DATA_N operate in opposition, such that when signal HS_DATA is asserted, signal HS_DATA_N is deasserted, and vice versa. Thus, signal HS_DATA acts as a signaling control signal while signal HS_DATA_N acts as a pulldown control signal. Specifically, when signal HS_DATA is asserted to turn on transistor N321, signal HS_DATA_N is deasserted to turn off transistor N322, and a positive voltage (i.e., reference voltage VREF (i.e., 800 mV) minus the voltage drop across resistor R323 and NMOS devices N321 and N324 (i.e., 400 mV)) is provided at USB port 311. Likewise, when signal HS_DATA is deasserted to turn off transistor N321, signal HS_DATA_N is asserted to turn on transistor N322, and USB port 311 is pulled to ground. In this manner, switching signals HS_DATA and HS_DATA_N control the signaling pattern of USB signal D+.

As noted above, the complementary USB signal D− (i.e., the other half of the differential USB signal) can be generated in substantially the same manner by corresponding circuitry in complementary USB signal generation circuit 215 (e.g., circuit 215 can include a voltage source that generates a reference voltage at 800 mV and an output sliver that switches that reference voltage to the D− pin of USB port 311 based on signals HS_DATA (which sets signal D− to 400 mV) and HS_DATA_N (which sets signal D− to ground)) with opposite logic to the D+ line.

As further noted above, the USB 2.0 specification requires that the output resistance of a USB transceiver be equal to 45 Ω ±10%. However, on-chip sheet resistors used in ICs typically exhibit resistance variations in the ±20-25% range. Therefore, the accurate resistance requirements of the USB 2.0 specification can be difficult to achieve using a single resistor. Therefore, in one embodiment, high-speed USB transmitter 210 can include multiple copies of output sliver 330 that can be selectively enabled by asserting an enable signal EN at the gate of transistor N324. The enabled slivers 330 can be selected such that USB signal D+ at USB port 311 is presented with a total resistance that is within the range required by the USB specification.

Figure 3B:
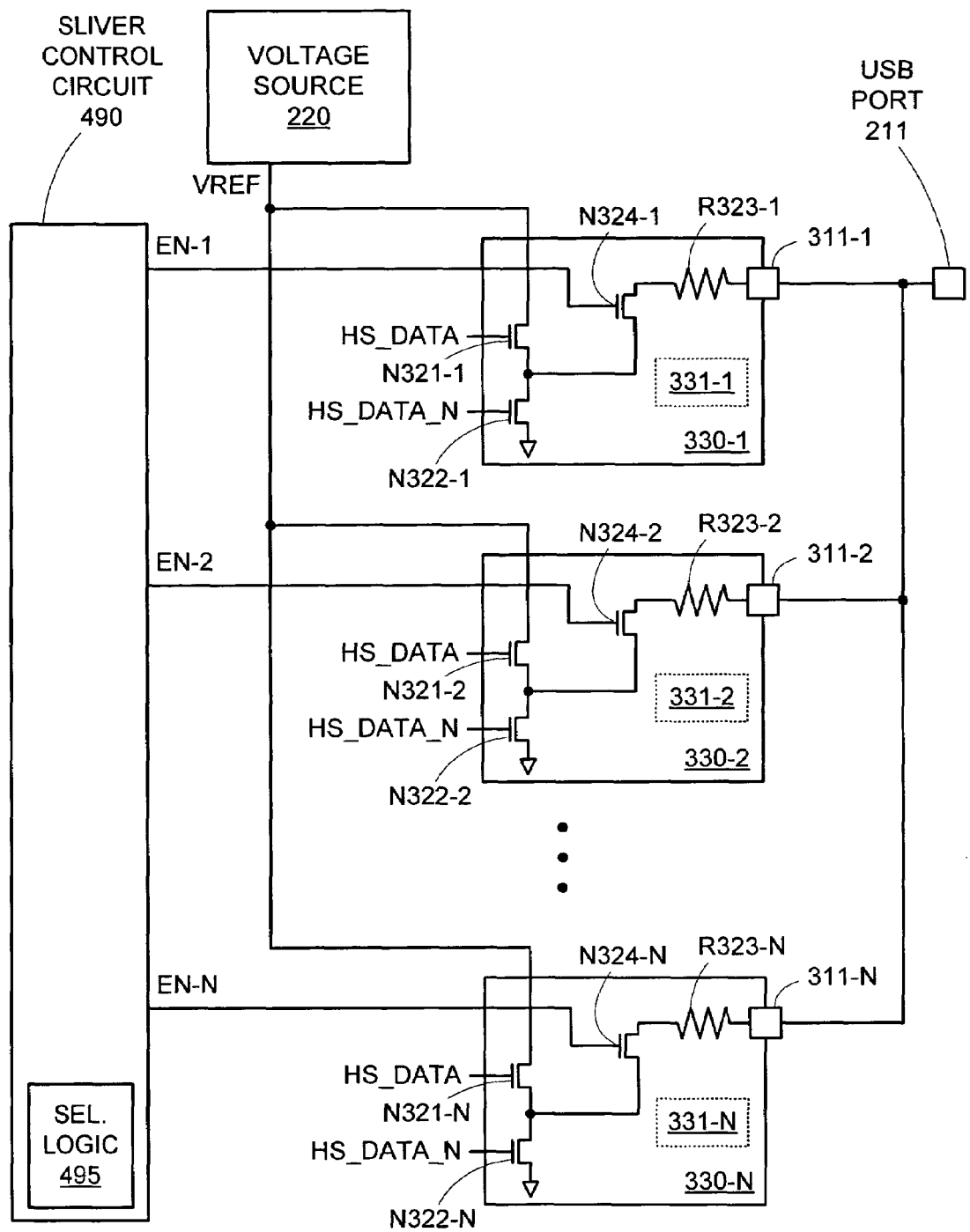
FIG. 3B shows a circuit diagram of another embodiment of the USB transceiver of FIG. 2.

For example, FIG. 3B shows a schematic diagram of another embodiment of high-speed USB-transmitter 210 that includes multiple output slivers 330 (i.e., output slivers 330-1, through 330-N) and a sliver control circuit 490 for selectively coupling each of slivers 330-1 through 330-N to USB port 211. Each of slivers 330-1 through 330-N can be substantially similar to output sliver 330 described with respect to FIG. 3A, and therefore the outputs of output slivers 330 in response to switching control signals HS_DATA and HS_DATA_N are all synchronous.

Sliver control circuit 490 selectively sends enable signals ENABLE-1 through ENABLE-N to control how many slivers are put in parallel to form the output driver. The selection logic 495 determines how the appropriate number of slivers to enable such that the total output resistance of the output slivers 330 will meet the USB 2.0 output resistance specification (i.e., 45 Ω ±10%). For example, selection logic 495 could enable various combinations of slivers 330 until a voltage at USB port 211 matches a precision reference voltage at 400 mV provided to selection logic 495. Various other selection algorithms and techniques will be readily apparent.

Note that because output resistors R323 in output slivers 330 are all connected in parallel between voltage source 220 and USB port 211, each individual resistor R323 can be much larger than a single resistor providing the same total resistance (since the total resistance provided by parallel resistors is equal to the reciprocal of the sum of the reciprocals of the individual resistors). Therefore, a USB transceiver based on multiple output slivers 330 can exhibit improved manufacturability and improved electrostatic discharge (ESD) resistance (due to the larger resistors R323).

In certain circumstances, it may be desirable to avoid the use of output resistors R323 for any purpose other than USB signal generation. Thus, in one embodiment, each sliver 330 can include a replica circuit 331 that includes duplicates of transistors N321, N322, N324 and/or resistor R326 for use in the resistance tuning process described above. As is well known in the art, matched resistors in an IC (e.g., output resistor R326 and its matching resistor in replica circuit 331) can be created with very similar resistance values, even if the absolute values of those resistors cannot be set to a precise resistance value. Therefore, the results obtained from a resistance tuning process using a replica of the output driver will be valid for the actual output resistors R323.

The various embodiments of the structures and methods of this invention that are described above are illustrative only of the principles of this invention and are not intended to limit the scope of the invention to the particular embodiments described. For example, transistors N321-1 through N321-N in each of output slices 330-1 through 330-N, respectively, could be replaced with a single transistor that connects and disconnects output slices 330-1 through 330-N to voltage regulator 310. Similarly, transistors N322-1 through N322-N in each of output slices 330-1 through 330-N, respectively, could be replaced with a single transistor that connects and disconnects output slices 330-1 through 330-N to ground. Thus, the invention is limited only by the following claims and their equivalents.

The invention claimed is:

1. A high-speed universal serial bus (USB) transceiver comprising:
   a USB port;
   a first signaling circuit for providing a first output signal, the first output signal switching between a reference voltage and a ground supply voltage;
   a first resistor for coupling the first output signal to a first data pin of the USB port;

selection logic; and a plurality of output slices, each of the plurality of output slices comprising:

an output terminal coupled to the first data pin of the USB port;

a high-speed switching circuit for generating a high speed data signal, the high speed data signal switching between a reference voltage and a ground supply voltage, the high speed data signal being synchronous with the first output signal; and an output resistor for coupling the high speed data signal to the output terminal, wherein the output resistor and the high-speed switching circuit in a first one of the plurality of output slices comprise the first resistor and the first signaling circuit, respectively, wherein the selection logic selectively enables a subset of the plurality of output slices to cause a total resistance of the output resistors in the subset of the plurality of output slices to be equal to a reference resistance value, and wherein the subset of the plurality of output slices includes the first one of the plurality of output slices.

2. The high-speed USB transceiver of claim 1, further comprising a first reference voltage generator, wherein the first signaling circuit comprises:

a first transistor, wherein a gate of the first transistor is coupled to receive a first switching control signal; and a second transistor, wherein a gate of the second transistor is coupled to receive a second switching control signal, wherein the first transistor and the second transistor are connected in series between the first reference voltage generator and a ground terminal, wherein the first resistor is connected between the first data pin of the USB port and a junction between the first transistor and the second transistor, and wherein the first switching control signal and the second switching control signal cause the first transistor and the second transistor to operate in opposition to generate the first output signal at the junction between the first transistor and the second transistor.

3. The high-speed USB transceiver of claim 1, wherein the reference voltage is 800 mV.

4. The high-speed USB transceiver of claim 1, further comprising:

a second signaling circuit for providing a second output signal, the second output signal switching between the reference voltage and a ground supply voltage, the second output signal being synchronous with the first output signal; and a second resistor for coupling the second output signal to the first data pin of the USB port.

5. The high-speed USB transceiver of claim 1, wherein the reference resistance value is 45Ω±10%.

6. The high-speed USB transceiver of claim 1, wherein each of the plurality of output slices further comprises tuning circuitry comprising:

a tuning resistor, the tuning resistor and the output resistor being matched resistors; and tuning circuitry for supplying the high speed data signal to the tuning resistor.

7. The high-speed USB transceiver of claim 1, further comprising:

a second signaling circuit for providing a second output signal, the second output signal switching between the reference voltage and a ground supply voltage, the second output signal being a complement of the first output signal; and a second resistor for coupling the second output signal to a second data pin of the USB port, wherein the first output signal and the second output signal form a differential USB signal.

8. The high-speed USB transceiver of claim 7, wherein the first signaling circuit is coupled to receive the reference voltage from a reference voltage generator circuit, and wherein the second signaling circuit is coupled to receive the reference voltage from the reference voltage generator circuit.

9. A universal serial bus (USB) apparatus comprising:

a USB port;

a first signaling circuit for generating a first output signal, the first output signal switching between a first reference voltage and a ground supply voltage;

a first resistive element coupled between the first signaling circuit and a first data pin of the USB port, wherein the first resistive element comprises a plurality of resistors connected to the first data pin of the USB port;

selection logic for selectably providing the first output signal to each of a first portion of the plurality of resistors, wherein the first output signal provided to the first resistive element by the first signaling circuit generates a first half of a high-speed differential USB signal at the first data pin of the USB port; and tuning circuitry for bypassing each of the plurality of resistors with a matched tuning resistor, wherein the selection logic selects the first portion of the plurality of resistors based on the matched tuning resistors.

10. The USB apparatus of claim 9, wherein the first portion of the plurality of resistors provide a total resistance equal to 45Ω±10%.

11. The USB apparatus of claim 9, further comprising:

a second signaling circuit for generating a second output signal, the second output signal being a complement of the first output signal; and a second resistive element coupled between the second switching circuit and a second data pin of the USB port, wherein the second output signal provided to the second resistive element by the second signaling circuit generates a second half of the high-speed differential USB signal.

12. The USB apparatus of claim 11, wherein the first output signal and the second output signal switch between a reference voltage and a ground supply voltage, the USB apparatus further comprising a reference voltage generator for providing the reference voltage to the first signaling circuit and to the second signaling circuit.

13. The USB apparatus of claim 9, wherein the USB device comprises at least one of a personal computer, a digital camera, a personal digital assistant, a digital music player, and a computer peripheral.

* * * * *